US009716511B1

(12) United States Patent
Yorita et al.

(10) Patent No.: US 9,716,511 B1
(45) Date of Patent: Jul. 25, 2017

(54) SIGNAL PROCESSING DEVICE

(71) Applicant: NIHON DEMPA KOGYO CO., LTD., Tokyo (JP)

(72) Inventors: Tomoya Yorita, Hokkaido (JP); Naoki Onishi, Hokkaido (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/434,058

(22) Filed: Feb. 16, 2017

(30) Foreign Application Priority Data

Feb. 18, 2016 (JP) ................. 2016-028818

(51) Int. Cl.
*H03M 1/12* (2006.01)
*H03B 5/32* (2006.01)
*H03L 7/08* (2006.01)
*H03K 19/177* (2006.01)
*H03M 1/34* (2006.01)

(52) U.S. Cl.
CPC .......... *H03M 1/1245* (2013.01); *H03B 5/32* (2013.01); *H03K 19/17704* (2013.01); *H03L 7/08* (2013.01); *H03M 1/34* (2013.01)

(58) Field of Classification Search
CPC . H03M 1/1245; H03B 5/32; H03K 19/17704; H03L 7/08

USPC .................................... 341/122, 155
See application file for complete search history.

(56) References Cited

U.S. PATENT DOCUMENTS 8,749,419 B2 * 6/2014 Moldsvor ........... H03M 1/0656
341/118
9,298,666 B2 * 3/2016 Le Tual ................ G06F 13/423

FOREIGN PATENT DOCUMENTS

JP          2009239847          10/2009

* cited by examiner

*Primary Examiner* — Khai M Nguyen
(74) *Attorney, Agent, or Firm* — Jianq Chyun IP Office

(57) ABSTRACT

A signal processing device includes a plurality of converters, a generator, a distributor, a first line, and a second line. A plurality of converters is configured to convert analog signals to digital signals based on a clock signal to output the digital signals. The generator is configured to generate the clock signal based on a reference signal. The distributor is configured to distribute a generated clock signal to the plurality of converters. The first line passes through only a region assigned to each of the plurality of converters to supply the analog signal to the converter. The second line passes through only the region to supply a distributed clock signal to the converter.

7 Claims, 2 Drawing Sheets

SIGNAL PROCESSING DEVICE

CROSS-REFERENCE TO RELATED APPLICATIONS

This application is based on and claims priority under 35 U.S.C. §119 to Japanese Patent Application No. 2016-028818, filed on Feb. 18, 2016, the entire content of which is incorporated herein by reference.

TECHNICAL FIELD

This disclosure relates to a signal processing device that performs a process to convert an analog signal to a digital signal.

DESCRIPTION OF THE RELATED ART

As a standard of a high-speed serial interface, there is JESD204B, which is formulated by a United States standardization body, JEDEC. As shown in Japanese Unexamined Patent Application Publication No. 2009-239847, JESD204B arranges a plurality of conversion units that convert an analog signal to a digital signal in parallel. JESD204B allows converting the plurality of analog signals simultaneously to the digital signals and outputting the digital signals. The use of JESD204B can substantially reduce wirings on a substrate; therefore, a demand for JESD204B is increasing in fields, such as communication devices and measuring equipment.

In a case of arranging in parallel the plurality of conversion units that convert the analog signals to the digital signals to convert the plurality of analog signals to the digital signals, there is a problem where a clock signal that is input to one conversion unit passes through a proximity of another conversion unit or a line for the analog signal input to another conversion unit to cause interference between the analog signals via lines for the clock signal.

FIG. 2 is a drawing illustrating an exemplary configuration of a conventional signal processing device. As illustrated in FIG. 2, a conventional signal processing device 100 includes a plurality of AD conversion units 102 and a clock distribution IC 103, which distributes the clock signal, on a printed circuit board 101. The clock distribution IC 103 supplies a synchronization signal and a sampling signal as the clock signals to the plurality of AD conversion units 102. The synchronization signal is for synchronizing the plurality of conversion units. The sampling signal is used when an AD conversion is perfoiined. In the case where the clock distribution IC 103 resides on the printed circuit board 101, lines for supplying the clock signal are arranged in proximities of the plurality of AD conversion units 102. This causes a problem where interference of the analog signals that are supplied to the adjacent AD conversion units 102 occurs via these lines.

A need thus exists for a signal processing device which is not susceptible to the drawback mentioned above.

SUMMARY

According to an aspect of this disclosure, there is provided a signal processing device that includes a plurality of converters, a generator, a distributor, a first line, and a second line. A plurality of converters is configured to convert analog signals to digital signals based on a clock signal to output the digital signals. The generator is configured to generate the clock signal based on a reference signal. The distributor is configured to distribute a generated clock signal to the plurality of converters. The first line passes through only a region assigned to each of the plurality of converters to supply the analog signal to the converter. The second line passes through only the region to supply a distributed clock signal to the converter.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
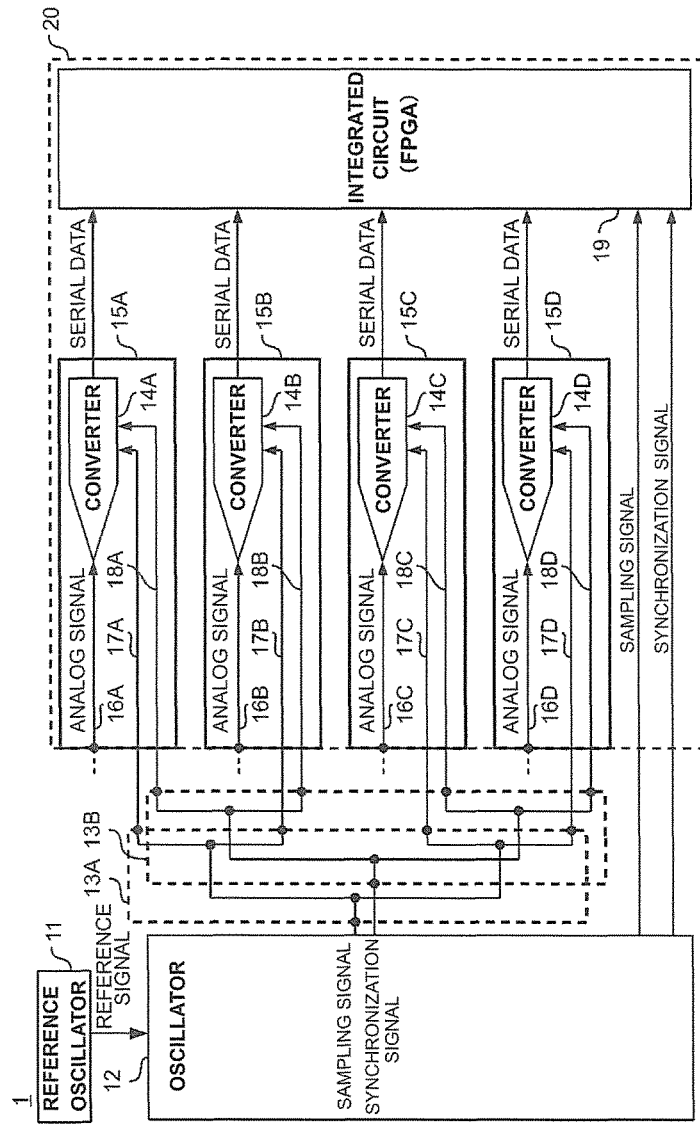
FIG. 1 is a drawing illustrating a configuration of a signal processing device according to this embodiment.
Figure 2:
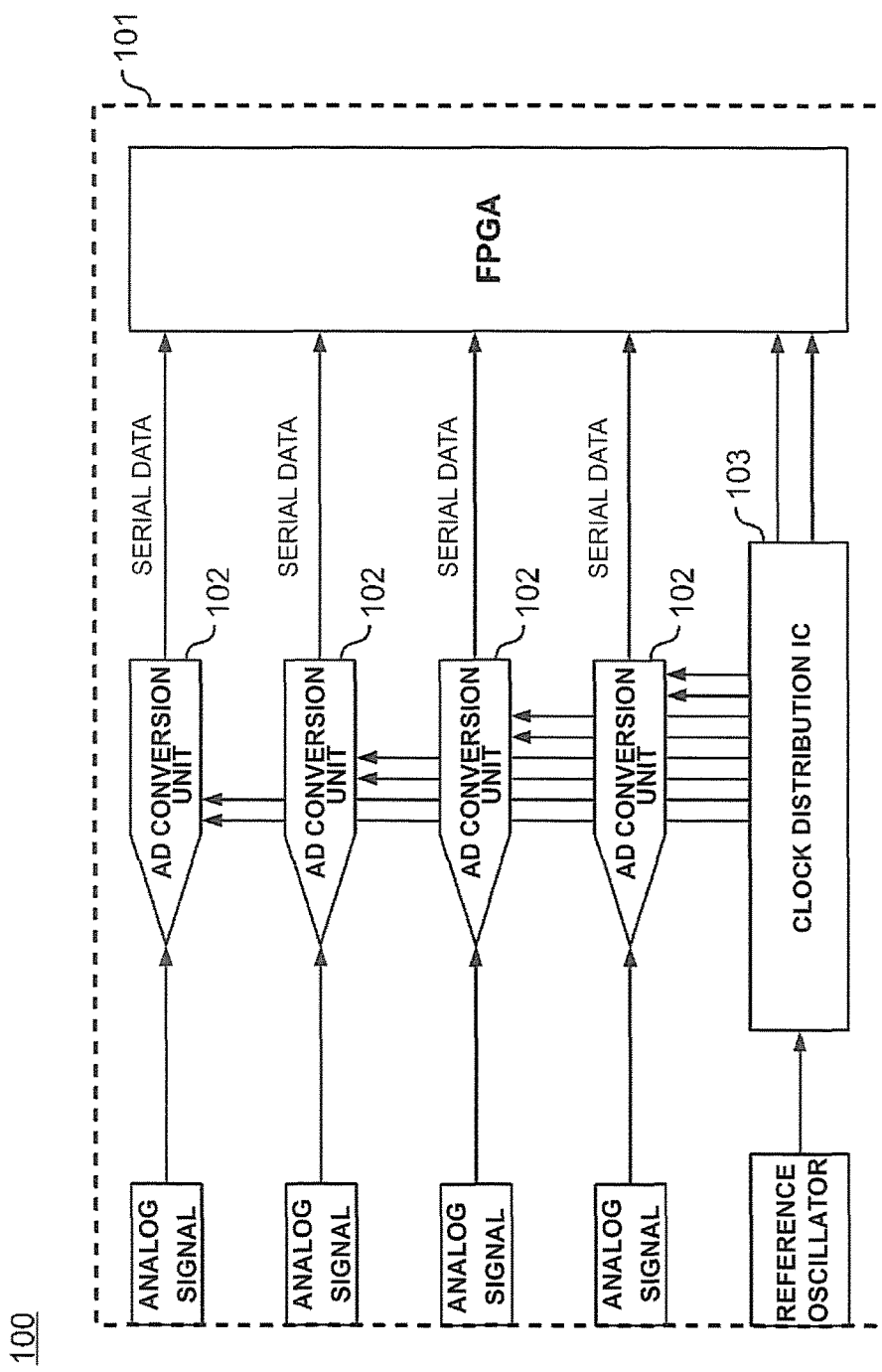
FIG. 2 is drawing illustrating an exemplary configuration of a conventional signal processing device.

FIG. 1 is a drawing illustrating a configuration of a signal processing device 1 according to this embodiment. The signal processing device 1 includes a reference oscillator 11, an oscillator 12, distributors 13 (such as 13A and 13B shown in FIG. 1), converters 14 (such as 14A to 14D shown in FIG. 1), shield cases 15 (such as 15A to 15D shown in FIG. 1), first lines 16 (such as 16A to 16D shown in FIG. 1), second lines 17 (such as 17A to 17D shown in FIG. 1) and 18 (such as 18A to 18D shown in FIG. 1), an integrated circuit 19, and a substrate 20.

The reference oscillator 11 is, for example, a crystal oscillator. The reference oscillator 11 generates a reference signal of a predetermined frequency to output the reference signal to the oscillator 12.

The oscillator 12 is configured by, for example, a Phase Locked Loop (PLL) circuit. The oscillator 12 serves as a generator. The oscillator 12 generates a synchronization signal and a sampling signal as a clock signal on the basis of the reference signal that is input from the reference oscillator 11. The synchronization signal is for synchronizing the plurality of converters 14. The sampling signal is used when the analog signal is converted to the digital signal in the plurality of converters 14. For example, a frequency of the sampling signal is 3.6 GHz. The synchronization signal is a frequency division signal of the sampling signal. A frequency of the synchronization signal is 22.5 MHz. The oscillator 12 outputs the sampling signal to the distributor 13A and the integrated circuit 19 and outputs the synchronization signal to the distributor 13B and the integrated circuit 19.

The distributors 13 distribute the clock signal generated in the oscillator 12 to the plurality of converters 14. The distributors 13 distribute the sampling signal and the synchronization signal output from the oscillator 12 with the distributor 13A and the distributor 13B formed on different substrates from one another.

The distributor 13A is, for example, a distribution circuit formed on the substrate. The distributor 13A distributes and outputs the sampling signal generated by the oscillator 12 to the plurality of converters 14. The distributor 13A includes one input terminal as an input portion to which the generated sampling signal is input and a plurality of output terminals as output portions from which the distributed sampling signals are output. In this embodiment, the four output terminals of the distributor 13A are disposed corresponding to the number of the converters 14. As illustrated in FIG. 1, a wiring pattern from the input terminal to the four output terminals in the distributor 13A is tree-shaped. Line lengths from the input terminal to the respective four output teiniinals are equal.

The distributor 13A outputs the distributed sampling signals to the plurality of the converters 14 via the second lines 17.

The distributor 13B is, for example, a distribution circuit formed on a different substrate from that of the distributor 13A. The distributor 13B distributes and outputs the synchronization signals generated by the oscillator 12 to the plurality of converters 14. Similarly to the distributor 13A, the distributor 13B includes one input terminal as an input portion to which the generated synchronization signal is input and a plurality of output terminals as output portions from which the distributed synchronization signals are output. In this embodiment, the four output terminals of the distributor 13B are disposed corresponding to the number of the converters 14.

A wiring pattern from the input terminal to the four output terminals in the distributor 13B is tree-shaped. Line lengths from the input terminal to the four respective output terminals are equal. The tree shape is an aspect in which one wiring branches to a plurality of wirings, and each of the wirings after branching further branches to a plurality of wirings. While FIG. 1 illustrates an example where one wiring branches to two wirings, the one wiring may branch to three or more wirings.

The distributor 13B outputs the distributed synchronization signals to the plurality of converters 14 via the second lines 18.

Thus, in the signal processing device 1, the sampling signal and the synchronization signal are distributed on the different base plates, and are input to the converters 14. Therefore, the wirings of the lines corresponding to the sampling signal and the wirings of the lines corresponding to the synchronization signal on the substrate 20 can be facilitated. Equalizing distances from the input terminal to the respective plurality of output terminals in the distributors 13A and 13B ensures preventing phases of the distributing signals from differing in accordance with the difference of the line lengths. The tree-shaped wiring patterns in the distributors 13A and 13B make it easier to achieve equal-length wirings in the wirings from the oscillator 12 to each of the plurality of converters 14.

In this embodiment, while the distributors 13 distribute the sampling signals and the synchronization signals on the different substrates from one another, this should not be construed in a limiting sense. The distributors 13 may distribute the sampling signals on a first surface in one substrate and distribute the synchronization signals on a second surface that is an opposite side of the first surface in this substrate. Such configuration ensures downsizing of the distributors 13.

The converters 14, the shield cases 15, the first lines 16, the second lines 17 and 18, and the integrated circuit 19 are disposed on the one substrate 20.

The plurality of converters 14 are AD converters that convert the analog signals to the digital signals on the basis of the clock signals output from the distributors 13 to output these digital signals to the integrated circuit 19 as serial data. In this embodiment, the signal processing device 1 includes the converters 14A to 14D as the plurality of converters 14 as illustrated in FIG. 1.

The converters 14A to 14D are each assigned with a region for wirings of the analog signals and the clock signals. Here, each of the regions for the wirings assigned to the respective converters 14A to 14D includes only lines connected to the converter 14 inside this region. The region does not include lines connected to the converters 14 inside the other regions. Disposing such regions ensures inhibiting the lines connected to the converter 14 inside this region and the lines connected to the converters 14 inside the different regions from this region from intersecting or coming close. This ensures the signal processing device 1 inhibiting the analog signals input to the respective converters 14 from interfering with the analog signals input to the other converters 14 via the lines that supply the clock signals.

The converters 14A to 14D are each connected to the first line 16, the second line 17, and the second line 18. The first line 16 passes through only the region for the wirings assigned to itself and supplies the analog signal to the converter 14. The second line 17 passes through only this region and supplies the sampling signal to the converter 14. The second line 18 passes through only these regions and supplies the synchronization signal to the converter 14.

For example, the converter 14A is connected with the first line 16A and the second lines 17A and 18A. Here, the first lines 16A to 16D and the second lines 17A to 17D and 18A to 18D connected to the respective converters 14 are disposed so as not to intersect with one another. Line lengths of the first lines 16A to 16D are equal, and similarly, line lengths of the second lines 17A to 17D and line lengths of the second lines 18A to 18D are also equal. Such configuration ensures preventing phases of the respective signals from differing in accordance with the differences of the line lengths.

While the second lines 17 and 18 are disposed on the one substrate 20, this should not be construed in a limiting sense. For example, two substrates may wire the respective second lines 17 and 18 to connect to the converters 14.

The respective converters 14A to 14D synchronize on the basis of the respective synchronization signals supplied from the second lines 18A to 18D and convert the analog signals supplied from the first lines 16A to 16D to the digital signals on the basis of the sampling signals supplied from the second lines 17A to 17D. The plurality of converters 14A to 14D each output the converted digital signal to the integrated circuit 19 as the serial data.

The regions for the wirings assigned to the respective converters 14A to 14D each include the shield case 15 as a shielding portion to prevent a signal input to the converter 14 arranged in this region and signals input to the other converters 14 arranged in the different regions from this region for the other wirings from interfering. Such configuration ensures further inhibiting the signals from interfering between the adjacent converters 14.

The integrated circuit 19 is, for example, a Field-Programmable Gate Array (FPGA). The integrated circuit 19 obtains the plurality of serial data output from the plurality of converters 14 on the basis of the sampling signal and the synchronization signal output from the oscillator 12 and performs a predetermined computation processing on the basis of the obtained serial data.

Effect of this Embodiment

As described above, the signal processing device 1 according to this embodiment includes the plurality of converters 14, which convert analog signals to output the digital signals on the basis of the clock signal, the distributor 13, which distributes the clock signal to the plurality of converters 14, the first line 16, which passes through only the region assigned to each of the plurality of converters 14 to supply the analog signal to the converter 14, and the second lines 17 and 18, which pass through only this region to supply the distributed clock signal to the converter 14. Such configuration ensures inhibiting the line connected to the converter 14 inside this region and the lines connected to the converters 14 inside the different regions from this region from intersecting or coming close. This ensures the signal processing device 1 inhibiting the analog signals input to the respective converters 14 from interfering with the analog signals input to the other converters 14 via the lines that supply the clock signals.

While the present disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure. For example, while the above-described embodiment describes an example in which the four converters 14A to 14D are used, this should not be construed in a limiting sense and it is only necessary that the plurality of converters 14 are disposed.

The signal processing device may further include a shielding portion in each of a plurality of regions. The shielding portion is configured to prevent the converter arranged in the region and a signal input to the converter arranged in another region from interfering. The signal processing device may have the respective second lines of the plurality of regions that are equal in line length.

The signal processing device may have line lengths that are equal from an input portion to which the generated clock signal is input to a respective plurality of output portions from which the clock signals are output to the respective plurality of converters in the distributor. The signal processing device may have a wiring pattern from the input portion to the output portions in a tree-shape in the distributor.

The generator may generate a sampling signal for synchronizing the plurality of the converters and a synchronization signal used when a conversion is performed as the clock signal, and the distributor may distribute the sampling signals and the synchronization signals on different substrates from one another. The generator may generate a sampling signal for synchronizing the plurality of the converters and a synchronization signal used when the conversion is performed as the clock signal, and the distributor may distribute the sampling signals on a first surface of one substrate and the synchronization signals on a second surface that is an opposite side of the first surface of the substrate.

According to the embodiment, an effect that can reduce interference between a plurality of AD converters to a minimum is provided.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A signal processing device, comprising:
   a plurality of converters, configured to convert analog signals to digital signals based on a clock signal to output the digital signals;
   a generator, configured to generate the clock signal based on a reference signal;
   a distributor, configured to distribute a generated clock signal to the plurality of converters;
   a first line that passes through only a region assigned to each of the plurality of converters to supply the analog signal to the converter; and
   a second line that passes through only the region to supply a distributed clock signal to the converter.

2. The signal processing device according to claim 1, further comprising:
   a shielding portion in each of a plurality of regions,
   the shielding portion being configured to prevent the converter arranged in the region and a signal input to the converter arranged in another region from interfering.

3. The signal processing device according to claim 1, wherein
   a respective second lines of a plurality of regions are equal in line length.

4. The signal processing device according to claim 1, wherein
   in the distributor, line lengths are equal from an input portion to which the generated clock signal is input to a respective plurality of output portions from which the clock signals are output to the respective plurality of converters.

5. The signal processing device according to claim 4, wherein
   in the distributor, a wiring pattern from the input portion to the output portions is in a tree-shape.

6. The signal processing device according to claim 1, wherein
   the generator generates a sampling signal for synchronizing the plurality of the converters and a synchronization signal used when a conversion is performed as the clock signal, and
   the distributor distributes the sampling signals and the synchronization signals on different substrates from one another.

7. The signal processing device according to claim 1, wherein
   the generator generates a sampling signal for synchronizing the plurality of the converters and a synchronization signal used when the conversion is performed as the clock signal, and
   the distributor distributes the sampling signals on a first surface of one substrate and the synchronization signals on a second surface that is an opposite side of the first surface of the substrate.

* * * * *